(12) United States Patent
Khojasteh et al.

(10) Patent No.: US 6,770,419 B2
(45) Date of Patent: Aug. 3, 2004

(54) LOW SILICON-OUTGASSING RESIST FOR BILAYER LITHOGRAPHY

(75) Inventors: Mahmoud M. Khojasteh, Poughkeepsie, NY (US); Ranee W. Kwong, Wappingers Falls, NY (US); Kuang-Jung Chen, Poughkeepsie, NY (US); Pushkara Rao Varanasi, Poughkeepsie, NY (US); Robert D. Allen, San Jose, CA (US); Phillip Brock, Sunnyvale, CA (US); Frances Houle, Fremont, CA (US); Ratnam Sooriyakumaran, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 34 days.

(21) Appl. No.: 10/241,937

(22) Filed: Sep. 11, 2002

(65) Prior Publication Data

US 2004/0048187 A1  Mar. 11, 2004

(51) Int. Cl.[7] .......................... G03C 1/73; G03F 7/039; G03F 7/20; G03F 7/30; G03F 7/36
(52) U.S. Cl. .................. 430/270.1; 430/914; 430/905; 430/326; 430/910; 430/313; 430/316; 430/317; 430/318; 430/328; 430/323; 430/331
(58) Field of Search .................. 430/270.1, 914, 430/905, 326, 910, 313, 316, 317, 318, 323, 328, 331

(56) References Cited

U.S. PATENT DOCUMENTS

| 4,702,792 A | * 10/1987 | Chow et al. ................. 438/692 |
| 5,759,629 A | 6/1998 | van Ooij et al. ............. 427/384 |
| 6,048,664 A | 4/2000 | Houlihan et al. ......... 430/270.1 |
| 6,146,793 A | 11/2000 | Schaedeli et al. .............. 430/18 |
| 6,165,682 A | 12/2000 | Foster et al. ............. 430/270.1 |
| 6,358,675 B1 | 3/2002 | Boardman et al. .......... 430/326 |
| 6,359,078 B1 | 3/2002 | Boardman et al. .......... 525/342 |
| 6,444,408 B1 | * 9/2002 | Brock et al. ................. 430/322 |
| 6,653,048 B2 | * 11/2003 | Brock et al. ............. 430/270.1 |
| 2002/0058204 A1 | 5/2002 | Khojasteh et al. ........ 430/270.1 |
| 2002/0177066 A1 | * 11/2002 | Song et al. .............. 430/270.1 |

FOREIGN PATENT DOCUMENTS

JP          2001288224 A     10/2001

OTHER PUBLICATIONS

YOR920000059US1 High Silicon Content Monomers and Polymers Suitable for 193NM Bilayer Resists, Ratnam Sooriyakumaran et al.

* cited by examiner

*Primary Examiner*—Mark F. Huff
*Assistant Examiner*—Sin J. Lee
(74) *Attorney, Agent, or Firm*—Steven Capella

(57) ABSTRACT

The silicon-containing resist compositions which have low silicon outgassing and high resolution lithographic performance, especially in bilayer or multilayer lithographic applications using 193 nm or shorter wavelength imaging radiation are enabled by the presence of an imaging polymer having silicon-containing, non-acid-labile pendant groups. The resist compositions of the invention are preferably further characterized by the substantial absence of silicon-containing acid-labile moieties.

7 Claims, No Drawings

LOW SILICON-OUTGASSING RESIST FOR BILAYER LITHOGRAPHY

BACKGROUND OF THE INVENTION

In the microelectronics industry as well as in other industries involving construction of microscopic structures (e.g. micromachines, magnetoresistive heads, etc.), there is a continued desire to reduce the size of structural features. In the microelectronics industry, the desire is to reduce the size of microelectronic devices and/or to provide greater amount of circuitry for a given chip size.

Effective lithographic techniques are essential to achieving reduction of feature sizes. Lithography impacts the manufacture of microscopic structures not only in terms of directly imaging patterns on the desired substrate, but also in terms of making masks typically used in such imaging. Typical lithographic processes involve formation of a patterned resist layer by patternwise exposing the radiation-sensitive resist to an imaging radiation. The image is subsequently developed by contacting the exposed resist layer with a material (typically an aqueous alkaline developer) to selectively remove portions of the resist layer to reveal the desired pattern. The pattern is subsequently transferred to an underlying material by etching the material in openings of the patterned resist layer. After the transfer is complete, the remaining resist layer is then removed.

The resolution capability of lithographic processes is generally a function of the wavelength of imaging radiation, the quality of the optics in the exposure tool and the thickness of the imaging layer. As the thickness of the imaging resist layer increases, the resolution capability decreases. Thinning of a conventional single layer resist to improve resolution generally results in compromise of the etch resistance of the resist which is needed to transfer the desired image to the underlying material layer. In order to obtain the resolution enhancement benefit of thinner imaging layers, multilayer lithographic processes (e.g., so-called bilayer process) have been developed. In multilayer lithographic processes, a so-called planarizing underlayer is used intermediate between the imaging resist layer (typically a silicon-containing resist) and the underlying material layer to be patterned by transfer from the patterned resist. The underlayer receives the pattern from the patterned resist layer, and then the patterned underlayer acts as a mask for the etching processes needed to transfer the pattern to the underlying material.

The imaging layer of a bilayer or multilayer resist process typically uses a silicon-containing acid-sensitive polymer. The silicon content acts to provide differential etch characteristics relative to the planarizing underlayer (which is typically free of silicon). Typically, the silicon-containing resist polymer contains at least about 5 or 6 wt. % silicon.

In addition to having significant silicon content, the imaging layer resist composition must also possess the desired lithographic performance with the imaging radiation of interest. With the continued move toward higher resolution lithography, the imaging radiation of interest is quickly becoming 193 nm wavelength (ArF) ultraviolet radiation and is expected to become 157 nm ($F_2$) ultraviolet radiation. Thus, the respective silicon-containing resists for use at these wavelengths must possess desirable optical characteristics and dissolution behavior (i.e., selective dissolution of exposed areas) to enable image resolution at a desired radiation wavelength. Given the extensive experience in the lithographic arts with the use of aqueous alkaline developers, it is important and highly desirable to achieve appropriate dissolution behavior in such commonly used developer solutions.

The general approach in developing resist for bilayer applications has largely been to place the required silicon content on the acid-sensitive imaging polymer in the form of acid labile silicon-containing moieties. This approach has generally resulted in resist compositions which release undesired volatile silicon compounds (outgassing) during the lithographic process. These volatile silicon compounds may deposit on sensitive portions of the lithographic equipment (e.g., lenses, etc.) leading to need for early replacement of expensive components, downtime for extra tool maintenance, etc. Thus, there is a desire for silicon-containing resist formulations where silicon outgassing is reduced or eliminated.

SUMMARY OF THE INVENTION

The invention provides silicon-containing resist compositions which have low silicon outgassing and high resolution lithographic performance, especially in bilayer or multilayer lithographic applications using 193 nm or shorter wavelength imaging radiation. The resist compositions of the invention are generally characterized by the presence of an imaging polymer having silicon-containing, non-acid-labile pendant groups. The resist compositions of the invention are preferably further characterized by the substantial absence of silicon-containing acid-labile moieties.

In one aspect, the invention encompasses a silicon-containing resist composition comprising:
   (a) an acid-sensitive imaging polymer, and
   (b) a radiation-sensitive acid generator,
wherein the acid-sensitive imaging polymer comprises a silicon-containing non-acid-labile pendant group.

The imaging polymer is preferably useful in 193 nm lithographic processes and preferably the contains substantially no silicon-containing acid-labile moieties. The silicon-containing, non-acid-labile pendant groups are preferably further characterized by the presence of a direct bond between a silicon atom of the pendant group and (i) a carbon atom of an ethylenic moiety forming part of a backbone of the imaging polymer or (ii) a carbon atom of a cyclic olefin moiety forming part of a backbone of the imaging polymer.

In another aspect, the invention encompasses a method of forming a patterned material structure on a substrate, the material being selected from the group consisting of semiconductors, ceramics and metals, the method comprising:
   (A) providing a substrate with a layer of the material,
   (B) forming a planarizing layer over the material layer,
   (C) applying a resist composition over the planarizing layer to form a resist layer, the resist composition comprising:
      (a) an acid-sensitive imaging polymer, and
      (b) a radiation-sensitive acid generator,
      wherein the acid-sensitive imaging polymer comprises a silicon-containing non-acid-labile pendant group,
   (D) patternwise exposing the substrate to radiation whereby acid is generated by the radiation-sensitive acid generator in exposed regions of the resist layer by the radiation,
   (E) contacting the substrate with an aqueous alkaline developer solution, whereby the exposed regions of the resist layer are selectively dissolved by the developer solution to reveal a patterned resist structure, (F) transferring resist structure pattern to the planarizing layer, by etching into the planarizing layer through spaces in the resist structure pattern, and (G) transferring the structure pattern to the material layer, by etching into the material layer through spaces in the planarizing layer pattern.

The etching of step (G) is preferably reactive ion etching. The imaging radiation preferably has a wavelength of about 193 nm. The substrate is preferably baked between steps (D) and (E).

These and other aspects of the invention are discussed in further detail below.

DETAILED DESCRIPTION OF THE INVENTION

The resist compositions of the invention are generally characterized by the presence of an imaging polymer having silicon-containing, non-acid-labile pendant groups. The resist compositions of the invention are preferably further characterized by the substantial absence of silicon-containing acid-labile moieties. These compositions exhibit low silicon outgassing and are especially capable of providing high resolution lithographic patterns in bilayer or multilayer lithographic processes. The invention further encompasses processes for creating and using patterned resist structures based on the resist compositions of the invention to form conductive, semiconductive and/or insulative structures.

The resist compositions of the invention preferably comprise:

(a) an acid-sensitive imaging polymer, and (b) a radiation-sensitive acid generator, wherein the acid-sensitive imaging polymer comprises a silicon-containing non-acid-labile pendant group.

The imaging polymer comprises (a) monomeric units having silicon-containing non-acid-labile pendant group of the invention. The imaging polymer preferably further comprises (b) monomeric units having acid-labile pendant groups which inhibit solubility of the polymer in aqueous alkaline solutions, and (c) monomeric units adapted to facilitate polymer formation by free radical polymerization. The unexposed imaging polymer is preferably substantially insoluble in aqueous alkaline solutions customarily used as developers.

The monomeric units (a) having the silicon-containing non-acid-labile pendant group are preferably have (i) a backbone portion which forms part of the imaging polymer backbone, and (ii) a silicon-containing pendant group. The backbone portion is preferably an ethylenic moiety or a cyclic olefinic moiety. Most preferably, at least one silicon atom from the silicon-containing pendant group is bonded directly to a carbon of the backbone portion. The silicon-containing pendant group is preferably further characterized by the absence of silicon—silicon bonds. Examples of some possible structures are illustrated below:

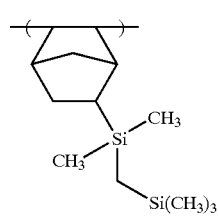

(I)

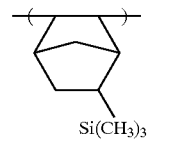

(II)

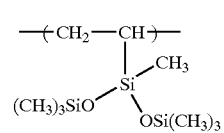

(III)

It should be understood that invention is open to other monomeric units having other silicon-containing non-acid-labile pendant groups. The examples above may further be varied by substituting for one or more of the hydrogens in the backbone moiety. For example, substitution with $C_1$–$C_6$ alkyl, fluoroalkyl, etc. Any such substitution preferably does not cause adverse effect on the performance of the resist. Of the monomeric units above, monomer (III) is generally most preferred. The imaging polymer preferably contains about 10 to 35 mole % of the silicon-containing monomeric units based on the total monomeric units contained in the polymer. Preferably, the proportion of monomeric unit (s) is selected to achieve a silicon content of at least about 5 wt. % based on the weight of the imaging polymer, more preferably about 6–10 wt. %.

The imaging polymer is preferably further characterized by the presence of acid-labile pendant moieties on at least a portion of the monomeric units (b) making up the imaging polymer. The acid-labile moieties preferably act to inhibit solubility of the resist composition in aqueous alkaline solutions. Preferred acid-labile protecting moieties are selected from the group consisting of tertiary alkyl (or cycloalkyl) esters (e.g., t-butyl, methyl cyclopentyl, methyl cyclohexyl, methyl adamantyl), ketals, and acetals. Tertiary butyl ester and methyl cyclopentyl ester are most preferred acid-labile protecting moieties. The acid labile pendant groups are preferably substantially free of silicon. If desired, combinations of monomers having differing protecting functional groups may be used. The monomeric units having acid-labile pendant moieties preferably have a backbone portion comprising a cyclic olefin or acrylic moiety which forms part of the polymer backbone.

The acid-labile pendant moieties are preferably present in sufficient amount to maintain the imaging polymer substantially insoluble in aqueous alkaline developers in the prior to exposure to any imaging radiation. Upon exposure to imaging radiation, at least a portion of the acid labile moieties in the exposed portions of the resist would be cleaved causing a shift in the aqueous alkaline solubility of the exposed portions of the resist. The imaging polymer preferably contains about 20 to 45 mole % of the acid-labile group containing monomeric units (b) based on the total monomeric units contained in the polymer.

Monomeric unit (c) may be any monomeric unit capable of facilitating free-radical copolymerization with monomeric units (a) and (b). Monomeric unit (c), in its copolymerized form, preferably does not contribute significant amounts of unsaturated carbon—carbon bonds which would excessively absorb radiation at 193 nm wavelengths. Preferably monomeric unit (c) is selected from the group consisting of maleic anhydride, maleimide, acrylate, fumarate, and acrylonitrile. More preferably, monomeric unit (c) is selected from maleic anhydride and maleimide. Most preferably, monomeric unit (c) is maleic anhydride. If monomer (c) is used, the imaging polymer preferably contains about 35 to 60 mole % of monomeric unit (c) based on the total monomeric units contained in the polymer.

One preferred imaging polymer comprises the following monomeric units:

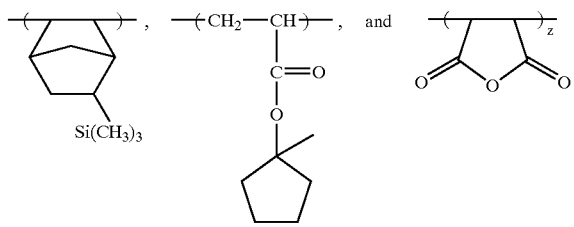

where x, y and z are mole % of each respective monomeric unit based on total monomeric units contained in said imaging polymer. x is preferably about 20–35, more preferably about 30, y is preferably about 20–35, more preferably about 30, and z is about 35–60, more preferably about 40.

In a more preferred embodiment, the imaging polymer comprises the following monomeric units:

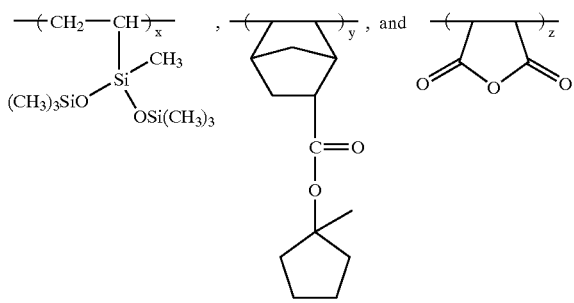

where x, y and z are mole % of each respective monomeric unit based on total monomeric units contained in said imaging polymer. x is preferably about 10–20, more preferably about 12–14, most preferably about 13, y is preferably about 30–45, more preferably about 35–40, most preferably about 37, and z is about 45–55, more preferably about 49–50.

The resist compositions of the invention contain a radiation-sensitive acid generator. The invention is not limited to the use of any specific radiation-sensitive acid generator or combination of acid generators, that is the benefits of the invention may be achieved using various radiation-sensitive acid generators known in the art. Preferred acid generators are those which contain reduced amounts (or preferably no) aryl moieties. Where aryl-containing acid generator is employed, the absorptive characteristics of the acid generator at wavelengths below 248 nm (e.g., 193 nm or 157 nm) may restrict the amount of acid generator that can be included in the formulation.

Examples of suitable radiation-sensitive acid generators include (but preferably with alkyl substituted for one or more of any indicated aryl moieties) onium salts such as triaryl sulfonium or diaryliodonium hexafluoroantimonate, hexafluoroarsenates, triflates, perfluoroalkane sulfonates (e.g., perfluoromethane sulfonate, perfluorobutane, perfluorohexane sulfonate, perfluorooctane sulfonate, etc.), perfluoroalkyl sulfonyl imide, perfluoroalkyl sulfonyl methide, perfluoroaryl sulfonyl imide, perfluoroaryl sulfonyl methide; substituted aryl sulfonates such as pyrogallols (e.g. trimesylate of pyrogallol or tris(sulfonate) of pyrogallol), sulfonate esters of hydroxyimides, N-sulfonyloxynaphthalimides (N-camphorsulfonyloxynaphthalimide, N-pentafluorobenzenesulfonyloxynaphthalimide), (α-α'bis-sulfonyl diazomethanes, naphthoquinone-4-diazides, alkyl disulfones and others.

The resist compositions of the invention will typically contain a solvent prior to their application to the desired substrate. The solvent may be any solvent conventionally used with acid-catalyzed resists which otherwise does not have any excessively adverse impact on the performance of the resist composition. Preferred solvents are propylene glycol monomethyl ether acetate and cyclohexanone.

The compositions of the invention may further contain minor amounts of auxiliary components such as dyes/sensitizers, base additives, etc. as are known in the art. Preferred base additives are weak bases which scavenge trace acids while not having an excessive impact on the performance of the resist. Preferred base additives are (aliphatic or alicyclic) tertiary alkyl amines, aromatic amines, or t-alkyl ammonium hydroxides such as t-butyl ammonium hydroxide (TBAH). If necessary, the compositions of the invention can be adjusted to respond to the desired imaging radiation by the addition of an appropriate dye or sensitizer to the composition. Preferably, the compositions of the invention are suitable for use with 193 nm and/or 157 nm imaging radiation.

The resist compositions of the invention preferably contain about 0.5–20 wt. % (more preferably about 1–15 wt. %) radiation-sensitive acid generator based on the total weight of imaging polymer in the composition. Where a solvent is present, the overall composition preferably contains about 50–95 wt. % solvent. The composition preferably contains about 1 wt. % or less of the base additive based on the total weight of acid sensitive polymer.

The resist compositions of the invention can be prepared by combining the imaging polymer, radiation-sensitive acid generator, and any other desired ingredients using conventional methods. The resist composition to be used in lithographic processes will generally have a significant amount of solvent.

The resist compositions of the invention are especially useful for lithographic processes used in the manufacture of integrated circuits on semiconductor substrates. The compositions are especially useful for bilayer or multilayer lithographic processes.

Semiconductor lithographic applications generally involve transfer of a pattern to a layer of material on the semiconductor substrate. The material layer of the semiconductor substrate may be a metal conductor layer, a ceramic insulator layer, a semiconductor layer or other material depending on the stage of the manufacture process and the desired material set for the end product. The composition of the invention is preferably applied directly over a planarizing underlayer material which has been directly applied over the material layer to be patterned. The planarizing underlayer may be any suitable underlayer material known in the art. More preferably, the planarizing underlayer comprises a crosslinked terpolymer of styrene, adamantyl acrylate and glycidyl acrylate. Such preferred underlayer compositions are described in US Published Patent Application No. US20020058204A1, published May 16, 2002, the disclosure of which is incorporated herein by reference.

Typically, the solvent-containing resist composition is applied using spin coating or other technique. The substrate with the resist coating is then preferably heated (pre-exposure baked) to remove the solvent and improve the coherence of the resist layer. The thickness of the applied layer is preferably as thin as possible provided that the thickness is preferably substantially uniform and that the resist layer be sufficient to withstand subsequent processing (typically reactive ion etching) to transfer the lithographic pattern to the planarizing underlayer. The pre-exposure bake step is preferably conducted for about 10 seconds to 15 minutes, more preferably about 15 seconds to one minute. The pre-exposure bake temperature may vary depending on the glass transition temperature of the resist.

After solvent removal, the resist layer is then patternwise-exposed to the desired radiation (e.g., 193 nm ultraviolet radiation). Where scanning particle beams such as electron beam are used, patternwise exposure may be achieved by scanning the beam across the substrate and selectively applying the beam in the desired pattern. More typically, where wavelike radiation forms such as 193 nm ultraviolet radiation, the patternwise exposure is conducted through a mask which is placed over the resist layer. For 193 nm UV radiation, the total exposure energy is preferably about 100 millijoules/cm$^2$ or less, more preferably about 50 millijoules/cm$^2$ or less (e.g. 15–30 millijoules/cm$^2$).

After the desired patternwise exposure, the resist layer is typically baked to further complete the acid-catalyzed reaction and to enhance the contrast of the exposed pattern. The post-exposure bake is preferably conducted at about 60–175° C., more preferably about 90–160° C. The post-exposure bake is preferably conducted for about 30 seconds to 5 minutes.

After post-exposure bake, the resist structure with the desired pattern is obtained (developed) by contacting the resist layer with an alkaline solution which selectively dissolves the areas of the resist which were exposed to radiation. Preferred alkaline solutions (developers) are aqueous solutions of tetramethyl ammonium hydroxide. The resulting lithographic structure on the substrate is then typically dried to remove any remaining developer solvent.

The pattern from the resist structure may then be transferred to the exposed portions of the planarizing underlayer of the invention by reactive ion etching or other suitable etch techniques known in the art.

After the opening of the planarizing underlayer of the invention, the underlying material layer to be patterned may then be etched using an etchant appropriate to the material layer composition. Once the desired pattern transfer has taken place, any remaining underlayer and resist may be removed using conventional stripping techniques.

Examples of lithographic processes where the composition of the invention may be useful as are disclosed in U.S. Pat. Nos. 4,855,017; 5,362,663; 5,429,710; 5,562,801; 5,618,751; 5,744,376; 5,801,094; and 5,821,469, the disclosures of which patents are incorporated herein by reference. Other examples of pattern transfer processes are described in Chapters 12 and 13 of "Semiconductor Lithography, Principles, Practices, and Materials" by Wayne Moreau, Plenum Press, (1988), the disclosure of which is incorporated herein by reference. It should be understood that the invention is not limited to any specific lithographic technique or device structure.

EXAMPLE 1

Synthesis of terpolymer of 5-trimethylsilylnorbornene, 1-methylcyclopentyl acrylate and maleic anhydride A 250 mL three-neck round-bottom flask was equipped with a magnetic stirrer, glass stopper, thermocouple thermometer, temperature-controlled heating mantle, and Friedrichs condenser connected to a nitrogen gas bubbler. The flask was charged with 5-trimethylsilyl-norbornene (26.93 g, 0.16 mol), 1-methylcyclopentyl acrylate (24.67 g, 0.16 mol), maleic anhydride (20.90 g, 0.213 mol), and 25 mL methyl acetate. The mixture was heated to 75° C. and a dimethyl 2,2'-azobisisobutyrate initiator (V-601 sold by Wako Pure Chemical Industries, Ltd.) (2.46 g, 0.01068 mol) was added. The reaction mixture was then nitrogen flushed, and heated to 75–80° C. (slightly below reflux temperature). After three hours, an additional portion of V-601 (2.46 g, 0.01068 mol) was added along with 25 mL of ethyl acetate, followed by nitrogen flushing and continued heating (at reflux, internal temp. about 70° C.). These additions of V-601 and ethyl acetate were repeated twice more at 3 hour intervals. After all of the initiator was been added (total of 9.84 g), the mixture was heated at reflux under nitrogen for an additional 12 hours. The cooled reaction mixture (quite viscous) was precipitated into 9 L of stirred 2-propanol (IPA). The solid product was stirred for 2 hours and then allowed to settle. The solid (a tan-orange powder) was isolated by filtration onto a medium frit glass filter funnel. The solid was washed with three 200-mL portions of 2-propanol, sucked dry, and dried 2–3 days in a vacuum oven at a temperature of 50–60° C. and an ultimate vacuum of less than 500 milliTorr. A total of 59.19 grams (81% based on monomer charge) of product was isolated. GPC Mw was 6130 versus polystyrene standards.

EXAMPLE 2

Synthesis of terpolymer of Vinylmethylbis(trimethylsiloxy)silane, 1-methyl-1-cyclopentyl 5-norbornene-2-carboxylate, and maleic anhydride Vinylmethylbis(trimethylsiloxy)silane ("3Si-V"-73 grams, 2.8× excess mole), 1-methyl-1-cyclopentyl 5-norbornene-2-carboxylate ("NB-MCP"-65.62 grams, 0.298 moles), maleic anhydride ("MA"-39.06 grams, 0.39 moles), 2,2'-azobisisobutylonitrile initiator (5.25 grams, 4 mole % total) and ethylacetate (150 grams) were combined in a one liter 3-neck round bottom flask equipped with condenser, thermometer, nitrogen inlet & magnetic stirrer bar. The reaction mixture was stirred at room temperature and bubbled with $N_2$ for 1.5 hours. The heating mantle was then turned on, and the reaction was conducted for 18 hours at 70° C. with a blanket $N_2$ flow. Then the reaction solution was cooled to room temperature and was added dropwise to a stirred methyl alcohol/isopropyl alcohol mixture (90:10). The resulting slurry was stirred overnight before filtration. The solid was collected by filration and air dried for five hours. Final drying was carried out in a vacuum oven at 65° C. overnight. Yield was 49%. $C^{13}$-NMR confirmed the composition mole ratio of 11.5:37.50:51 (3Si-V:NB-MCP:MA). GPC Mw was 7200/1.60.

EXAMPLE 3

The terpolymer of Example 1 was dissolved in propylene glycol monomethyl ether acetate (PGMEA) with 5 wt. % (based on weight of terpolymer) of di(t-butylphenyl) iodonium perfluorooctane sulfonate, and 0.12 wt. % (based on weight of terpolymer) of 1-t-butyloxycarbonyl 2-phenyl benzimidazole to make a solution of 9 wt. % solid content. The resulting solution was filtered through 0.2 μm filter. The resulting resist formulation was then spin-coated onto a substrate pre-coated with a 400 nm thick underlayer (crosslinked terpolymer of styrene, adamantyl acrylate and glycidyl acrylate). The resist-coated substrate was then post-apply baked for 60 seconds at 130° C. The resist-coated substrate was then imaged with 193 nm radiation on an ASML stepper (0.75NA). The exposed substrate was then post-exposure baked (PEB) for 60 seconds at 130° C. The image was developed using a single spray puddle develop process with 2.38 wt. % aqueous solution of tetramethyl ammonium hydroxide for 60 seconds. A 140 nm 1:1 lines/space pattern was resolved.

EXAMPLE 4

The terpolymer of Example 1 was dissolved in PGMEA with 4 wt. % (based on weight of terpolymer) of di(t-butylphenyl) iodonium perfluorobutane sulfonate, 5 wt. % (based on weight of terpolymer) of bicyclo[2.2.1]hept-5-ene-2,3-dicarboximido perfluorobutane sulfonate and 0.16 wt. % (based on weight of terpolymer) 1-t-butyloxycarbonyl 2-phenyl benzimidazole to make a solution of 9 wt. % solid content. The resulting solution was filtered through 0.2 μm filter. The resulting resist formulation was then spin-coated onto a substrate pre-coated with a 400 nm thick underlayer (crosslinked terpolymer of styrene, adamantyl acrylate and glycidyl acrylate). The resist-coated substrate was then post-apply baked for 60 seconds at 130° C. The resist-coated substrate was then imaged with 193 nm radiation on an ASML stepper (0.75NA). The exposed substrate was then post-exposure baked (PEB) for 60 seconds at 130° C. The image was developed using a single spray puddle develop process with 2.38 wt. % aqueous solution of tetramethyl ammonium hydroxide for 60 seconds. A 90 nm 1:1 lines/space pattern was resolved.

EXAMPLE 5

The terpolymer of Example 2 was dissolved in PGMEA with 5 wt. % (based on weight of terpolymer) of di(t-butylphenyl) iodonium perfluorooctane sulfonate, 4 wt. % (based on weight of terpolymer) of bicyclo[2.2.1]hept-5-ene-2,3-dicarboximido perfluorobutane sulfonate and 0.12 wt. % (based on weight of terpolymer) 1-t-butyloxycarbonyl 2-phenyl benzimidazole to make a solution of 10 wt. % solid content. The resulting solution was filtered through 0.2 μm filter. The resulting resist formulation was then spin-coated onto a substrate pre-coated with a 400 nm thick underlayer (crosslinked terpolymer of styrene, adamantyl acrylate and glycidyl acrylate). The resist-coated substrate was then post-apply baked for 60 seconds at 130° C. The resist-coated substrate was then imaged with 193 nm radiation on an ASML stepper (0.75NA). The exposed substrate was then post-exposure baked (PEB) for 60 seconds at 130° C. The image was developed using a single spray puddle develop process with 2.38 wt. % aqueous solution of tetramethyl ammonium hydroxide for 60 seconds. A 120 nm 1:1 lines/space pattern was resolved.

Outgassing Data

Resist-coated substrates of Examples 4 and 5 were evaluated for outgassing rate during exposure to actinic radiation (193 nm) a GC-MS protocol.

|  | Total Outgassing Flux (molecules/cm² s) | Si-Containing Species (molecules/cm² s) |
|---|---|---|
| Example 4 | 4.50E+011 | 1.50E+009 |
| Example 5 | 4.00E+012 | 5.00E+007* |

*Detection limit of test.

What is claimed is:

1. A silicon-containing resist composition, said composition comprising (a) an acid-sensitive imaging polymer comprising the following monomeric units:

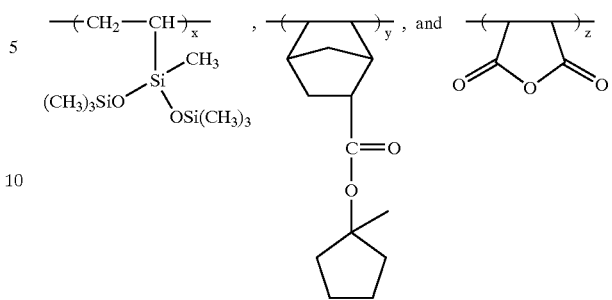

where x, y and z are mole % of each respective monomeric unit based on total monomeric units contained in said imaging polymer, and (b) a radiation-sensitive acid generator.

2. The composition of claim 1 wherein x is about 10–20, y about 30–45 and z is about 45–55.

3. A method of forming a patterned material structure on a substrate, said material being selected from the group consisting of semiconductors, ceramics and metals, said method comprising:

(A) providing a substrate with a layer of said material,
(B) forming a planarizing layer over said material layer,
(C) applying a resist composition over said planarizing layer to form a resist layer, said resist composition comprising:
   (a) an acid-sensitive imaging polymer comprising the following monomeric units:

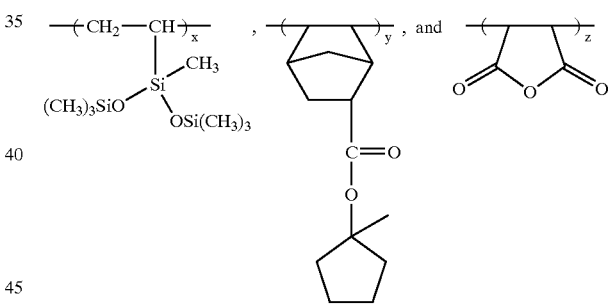

where x, y and z are mole % of each respective monomeric unit based on total monomeric units contained in said imaging polymer, and
   (b) a radiation-sensitive acid generator,
patternwise exposing said substrate to radiation whereby acid is generated by said radiation-sensitive acid generator in exposed regions of said resist layer by said radiation,
(E) contacting said substrate with an aqueous alkaline developer solution, whereby said exposed regions of said resist layer are selectively dissolved by said developer solution to reveal a patterned resist structure,
(F) transferring resist structure pattern to said planarizing layer, by etching into said planarizing layer through spaces in said resist structure pattern, and
(G) transferring said structure pattern to said material layer, by etching into said material layer through spaces in said planarizing layer pattern.

4. The method of claim 3 wherein said etching of step (G) comprises reactive ion etching.

5. The method of claim 3 wherein said radiation has a wavelength of about 193 nm.

6. The method of claim 3 wherein said substrate is baked between steps (D) and (E).

7. The method of claim 3 wherein x is about 10–20, y is about 30–45 and z is about 45–55.

* * * * *